(12) United States Patent
Kumar et al.

(10) Patent No.: US 10,693,496 B2
(45) Date of Patent: Jun. 23, 2020

(54) MEMORY SYSTEM WITH LDPC DECODER AND METHOD OF OPERATING SUCH MEMORY SYSTEM AND LDPC DECODER

(71) Applicant: SK hynix Inc., Gyeonggi-do (KR)

(72) Inventors: Naveen Kumar, San Jose, CA (US); Aman Bhatia, San Jose, CA (US); Chenrong Xiong, San Jose, CA (US); Yu Cai, San Jose, CA (US); Fan Zhang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 63 days.

(21) Appl. No.: 16/010,026

(22) Filed: Jun. 15, 2018

(65) Prior Publication Data

US 2019/0068220 A1 Feb. 28, 2019

Related U.S. Application Data

(60) Provisional application No. 62/551,602, filed on Aug. 29, 2017.

(51) Int. Cl.
| | | |
|---|---|---|
| *H03M 13/00* | (2006.01) | |
| *H03M 13/11* | (2006.01) | |
| *G06F 11/10* | (2006.01) | |
| *G06N 3/04* | (2006.01) | |
| *G06N 3/08* | (2006.01) | |
| *G11C 29/52* | (2006.01) | |
| *G11C 29/04* | (2006.01) | |

(52) U.S. Cl.
CPC ..... *H03M 13/1108* (2013.01); *G06F 11/1048* (2013.01); *G06F 11/1068* (2013.01); *G06N 3/0454* (2013.01); *G06N 3/08* (2013.01); *H03M 13/6597* (2013.01); *G11C 29/52* (2013.01); *G11C 2029/0411* (2013.01)

(58) Field of Classification Search
None
See application file for complete search history.

(56) References Cited

U.S. PATENT DOCUMENTS

| | | | |
|---|---|---|---|
| 10,389,383 B2 | 8/2019 | Xiong et al. | |
| 10,491,243 B2 | 11/2019 | Kumar et al. | |
| 2007/0180345 A1* | 8/2007 | Ismail | H03M 13/1148 714/752 |
| 2008/0109703 A1* | 5/2008 | Brandman | G06F 11/1068 714/763 |

(Continued)

OTHER PUBLICATIONS

W. R. Caid and R. W. Means, "Neural network error correcting decoders for block and convolutional codes," [Proceedings] GLOBECOM '90: IEEE Global Telecommunications Conference and Exhibition, San Diego, CA, USA, 1990, pp. 1028-1031 vol. 2. doi: 10.1109/GLOCOM.1990.116658 (Year: 1990).*

(Continued)

*Primary Examiner* — Daniel F. McMahon
(74) *Attorney, Agent, or Firm* — IP & T Group LLP

(57) ABSTRACT

A memory system, a bit-flipping (BF) low-density parity check (LDPC) decoder included in the memory system and operating methods thereof in which such decoder or decoding has a reduced error floor. Such a BF LDPC decoder is configured using a deep learning framework of trained and training neural networks and data separation that exploits the degree distribution information of the constructed LDPC codes.

19 Claims, 7 Drawing Sheets

(56) References Cited

U.S. PATENT DOCUMENTS

| | | | | |
|---|---|---|---|---|
| 2016/0006462 A1* | 1/2016 | Hanham | ........... | H03M 13/3715 |
| | | | | 714/764 |
| 2016/0335536 A1* | 11/2016 | Yamazaki | ............ | G06N 3/0454 |
| 2018/0343017 A1* | 11/2018 | Kumar | ............... | H03M 13/1108 |

OTHER PUBLICATIONS

E. Nachmani, E. Marciano, L. Lugosch, W. J. Gross, D. Burshtein and Y. Be'ery, "Deep Learning Methods for Improved Decoding of Linear Codes," in IEEE Journal of Selected Topics in Signal Processing, vol. 12, N. 1, pp. 119-131, Feb. 2018.doi: 10.1109/JSTSP.2017.2788405 (Year: 2018).*

Meng Wu, Wei-Ping Zhu and S. Nakamura, "A hybrid fuzzy neural decoder for convolutional codes," 1998 IEEE International Symposium on Circuits and Systems (ISCAS), Monterey, CA, 1998, pp. 235-238 vol. 3. (Year: 1998).*

\* cited by examiner

MEMORY SYSTEM WITH LDPC DECODER AND METHOD OF OPERATING SUCH MEMORY SYSTEM AND LDPC DECODER

CROSS-REFERENCE TO RELATED APPLICATION(S)

This application claims the benefit of U.S. Provisional Application No. 62/551,602, filed Aug. 29, 2017, the entire contents of which are incorporated herein by reference.

BACKGROUND

1. Field

Embodiments of the present disclosure relate to a memory system with a low-density parity check (LDPC) decoder, and in particular a bit-flipping (BF) LDPC decoder, and method of operating such components.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller can include an embedded processor that can execute functional components such as firmware. The SSD functional components are device specific, and in most cases, can be updated.

The two main types of flash memory components are named after the NAND and NOR logic gates. The individual flash memory cells exhibit internal characteristics similar to those of their corresponding gates. The NAND-type flash memory may be written and read in blocks (or pages) which are generally much smaller than the entire memory space. The NOR-type flash allows a single machine word (byte) to be written to an erased location or read independently. The NAND-type operates primarily in memory cards, USB flash drives, solid-state drives, and similar products, for general storage and transfer of data.

NAND flash-based storage devices have been widely adopted because of their faster read/write performance, lower power consumption, and shock proof features. In general, however, they are more expensive compared to hard disk drives (HDD). To bring costs down, NAND flash manufacturers have been pushing the limits of their fabrication processes towards 20 nm and lower, which often leads to a shorter usable lifespan and a decrease in data reliability. As such, a much more powerful error correction code (ECC) is required over traditional Bose-Chaudhuri-Hocquenghem (BCH) codes to overcome the associated noises and interferences, and thus improve the data integrity. One such ECC is low-density parity-check (LDPC) code. Various algorithms can be utilized for decoding LDPC codes more accurately and faster.

In this context embodiments of the present invention arise.

SUMMARY

Aspects of the present invention include memory systems. One such memory system comprises a memory device, and a controller in communication with the memory device. The controller comprises storage to store training data and a decoder. The decoder comprises a trained neural network assembly into which the training data is input, and which performs multiple iterations of decoding to generate decoded data including unsuccessfully decoded data. The decoder further comprises a data separation component to separate the unsuccessfully decoded data output from the trained neural network assembly with respect to variable nodes of different degrees in parity and data regions of the decoded data, and training neural networks, each of which receives from the data separation component unsuccessfully decoded data with respect to at least one of the variable nodes of different degrees in the parity and data regions.

Further aspects of the present invention includes decoders, particularly bit-flipping (BF) low-density parity check (LDPC) decoders. One such BF LDPC decoder comprises a trained neural network assembly into which training data is input, and which performs multiple iterations of decoding including a first iteration of decoding in which first unsuccessfully decoded data is generated and an $n^{th}$ iteration of decoding in which $n^{th}$ unsuccessfully decoded data is generated (n being a whole number greater than 1); a data separation component configured to separate $n^{th}$ unsuccessfully decoded data output from the trained neural network assembly with respect to a multiple degree distribution of variable nodes in parity and data regions of the decoded data; and training neural networks, including a first training neural network to receive from the data separation component unsuccessfully decoded data of a first cluster of one or more variable nodes, a second training neural network to receive from the data separation component unsuccessfully decoded data of a second cluster of one or more variable nodes, and a third training neural network to receive from the data separation component unsuccessfully decoded data of a third cluster of one or more variable nodes.

Additional aspects of the present invention include methods, particularly methods of operating memory systems including or associated with BF LDPC decoders. One such method comprises inputting training data from a storage into a trained neural network assembly of a decoder of the memory system; performing multiple iterations of decoding in the trained neural network assembly, and outputting unsuccessfully decoded data of a last of the multiple iterations; separating the unsuccessfully decoded data output from the trained neural network assembly with respect to variable nodes of different degrees in parity and data regions of the unsuccessfully decoded data; and training a plurality of neural networks, each receiving unsuccessfully decoded data of at least one of the variable nodes of different degrees.

DETAILED DESCRIPTION

Figure 1:
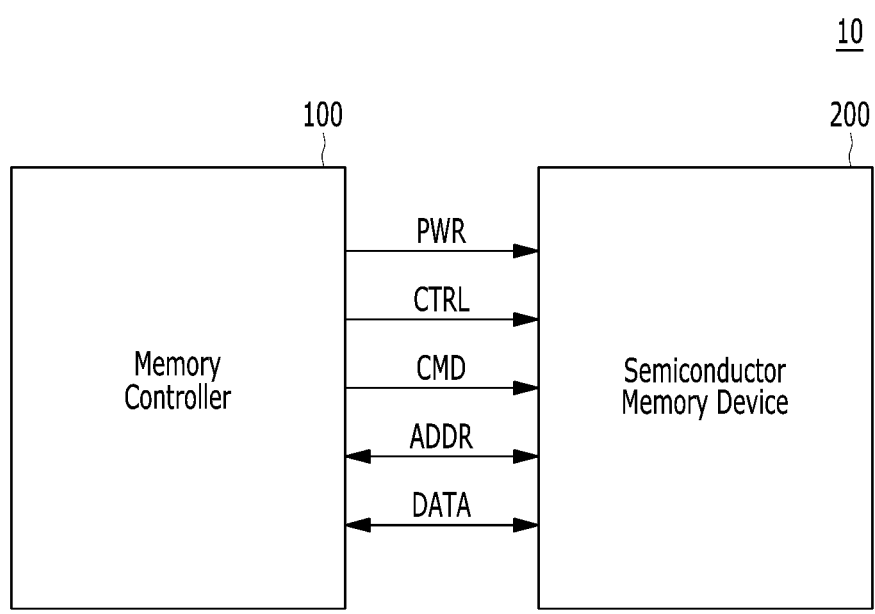
FIG. 1 is a block diagram schematically illustrating a memory system in accordance with an embodiment of the present invention.

Various embodiments are described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like does not necessarily mean only one embodiment, and different references to any such phrases is not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims, and the invention encompasses numerous alternatives, modifications and equivalents. Numerous specific details are set forth in the following description in order to provide a thorough understanding of the invention. These details are provided for the purpose of example; the invention may be practiced according to the claims without some or all of these specific details. For clarity, technical material that is known in the technical fields related to the invention has not been described in detail so that the invention is not unnecessarily obscured.

FIG. 1 is a block diagram schematically illustrating a memory system in accordance with an embodiment of the present invention.

Referring FIG. 1, the memory system 10 may include a memory controller 100 and a semiconductor memory device 200, which may represent more than one such device. The semiconductor memory device(s) 200 may be flash memory device(s).

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
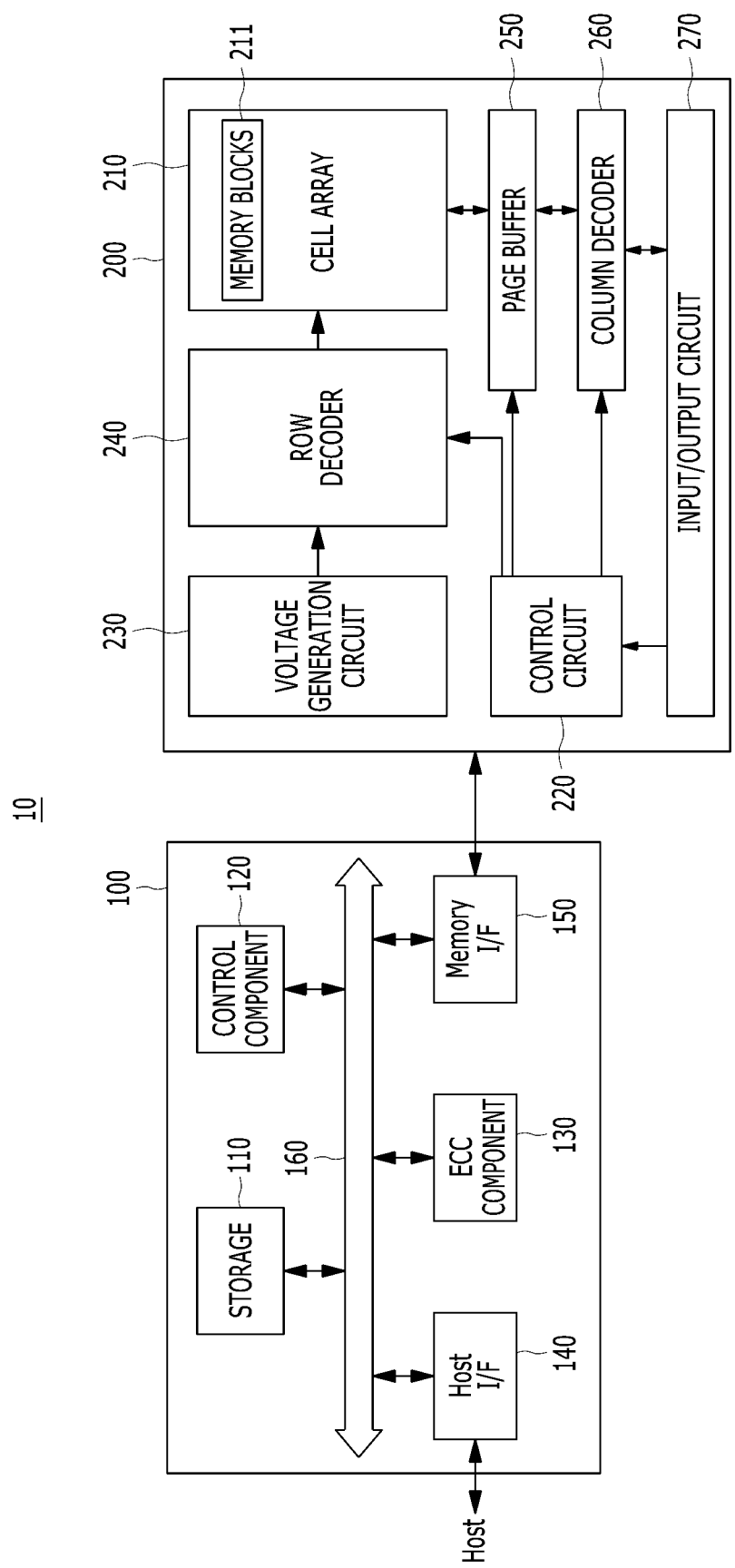
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In some embodiments, the ECC component 130 may perform an error correction operation based on a coded modulation such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). As such, the ECC component 130 may include all circuits, systems or devices for suitable error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
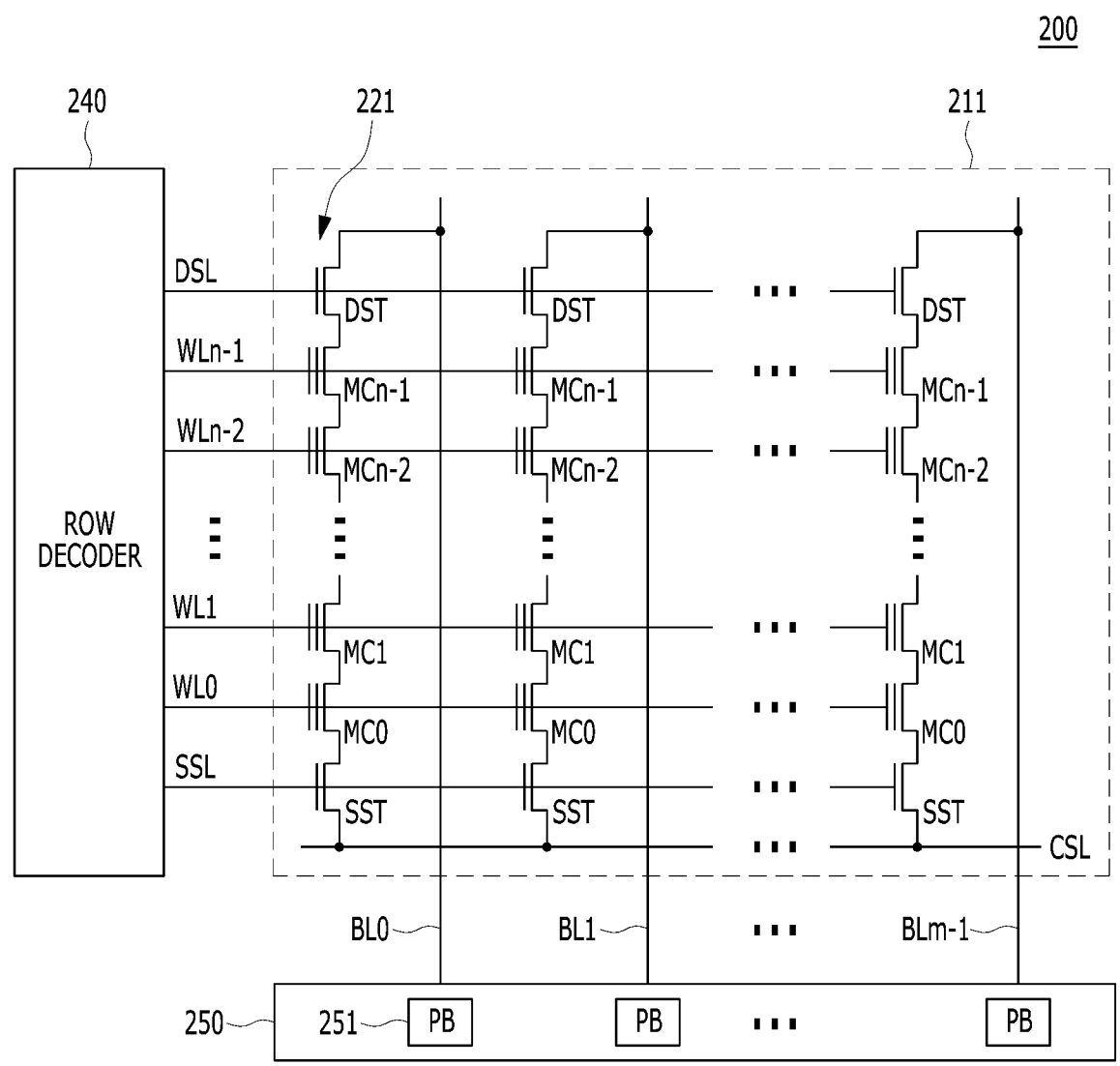
FIG. 3 is a circuit diagram illustrating a memory block of a memory device of a memory system in accordance with an embodiment of the present invention.

The page buffer 250 may be in electrical communication with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit/receive data to/from the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 may temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
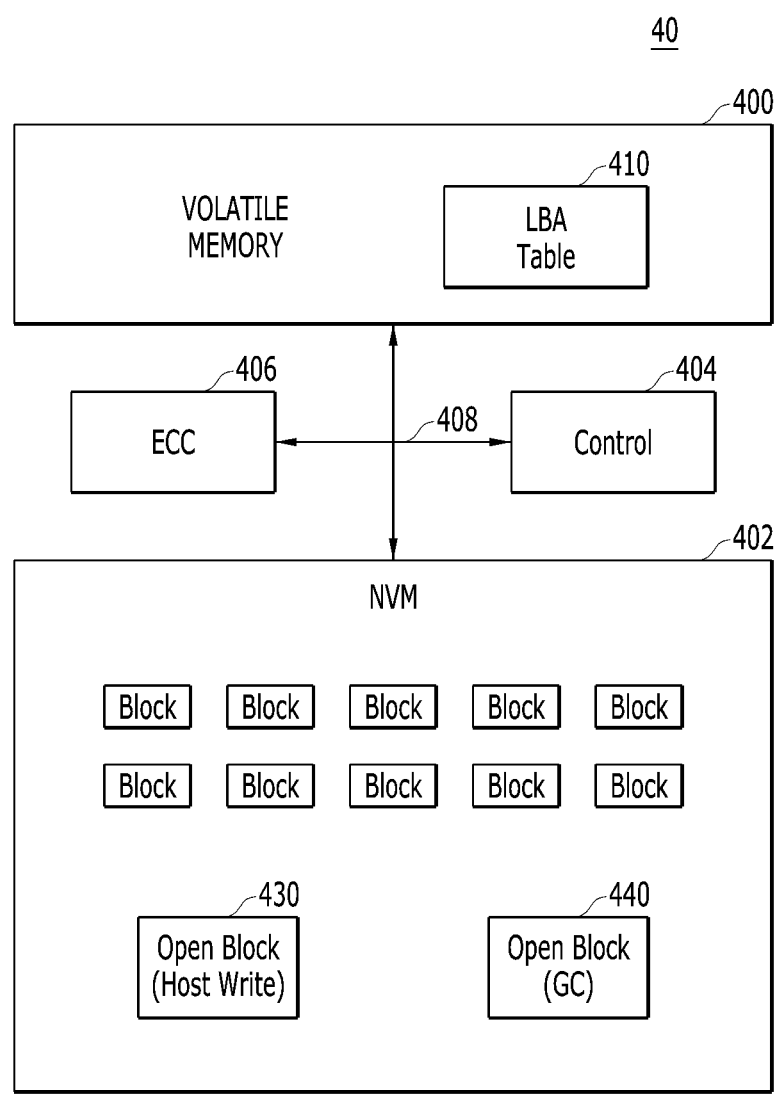
FIG. 4 is a diagram of an exemplary memory system in accordance with an embodiment of the present invention.

Referring to FIG. 4, a general example of a memory system 40 is schematically illustrated. The memory system 40 may include a volatile memory 400 (e.g., a DRAM), a non-volatile memory (NVM) 402 (e.g., NAND), a control component or control logic 404, such as described herein, an error correcting code (ECC) module 406, such as described herein, and a bus 408 through which these components of the memory system 40 communicate. The volatile memory 400 may include a logical bit address LBA table 410 for mapping physical-to-logical addresses of bits. The NVM 402 may include a plurality of memory blocks (and/or a plurality of super memory blocks), as well as an open block for host writes 430 and an open block for garbage collection (GC) 440. The memory system 40 shows a general memory system. Additional/alternative components that may be utilized with memory systems to effectuate the present invention will be understood to those of skill in the art in light of this disclosure.

As referred to herein, terms such as "NAND" or "NVM" may refer to non-volatile memories such as flash memories which may implement error correcting code processes. Further, "DRAM" may refer to volatile memories which may include components such as controllers and ECC modules.

Low-density parity-check (LDPC) codes are a family of linear block forward error-correction (FEC) codes whose parity check matrix can be represented by a low-density parity-check matrix. LDPC codes are used extensively for providing data reliability in data storage and transmission applications.

There are many iterative decoding algorithms for LDPC codes, such as bit-flipping (BF) decoding algorithms, belief-propagation (BP) decoding algorithms, sum-product (SP) decoding algorithms, min-sum decoding algorithms, Min-Max decoding algorithms, etc.

While belief-propagation (BP) and related decoders are more powerful, due to their higher complexity, less powerful BF decoders can be used when the number of errors is low. Moreover, BF decoders can be used to reduce computational overhead by reducing the frequency for triggering the more powerful but more power consuming BP decoders.

A BF decoder stores only the current value of each code-bit instead of storing soft information as BP decoders do. The value of each code-bit may be flipped iteratively based on the information of the number of unsatisfied check-nodes for each code-bit. Different rules may be defined to decide whether code-bits are flipped or not.

Usually, in BF algorithms, there are two factors used in determining whether and where a variable node needs to be flipped or not. The first factor may be referred to as the flipping indicator, given as u(j), of each variable node j. The second factor may be referred to a flipping threshold T. In each iteration, u(j) and T are calculated based on some rules. After calculating/determining u(j) and T, whether variable node j is to be flipped or not is based on the relationship between u(j) and T. For example, if u(j) is greater than T, variable node j is to be flipped. Otherwise, variable node j is still the same as the decision of a previous iteration.

BF codes may be optimized heuristically to reduce the failure rate of the LDPC decoder. However, there is an error floor observed in performance that cannot be removed using heuristic techniques.

Aspects of the present invention are directed to improvements in the performance of a bit-flipping (BF) LDPC decoder. In particular, techniques are provided for training a neural network in defining rules for a BF LDPC decoder to reduce the error floor. In an embodiment, the techniques advantageously exploit the degree distribution of the LDPC codes.

If failed codewords are collected, it is observed that the majority of errors are in the parity regions that cannot be corrected by traditional methods. This is because variable nodes in the parity region have a lower degree than variable nodes in the data region. The present disclosure provides a learning methodology that can exploit the degree distribution information in training and thereby reduce the error floor.

The training of a deep learning network becomes more challenging if the classification problem has highly imbalanced classes. Proposals that address the training of these imbalance classes provide performance gains, but the error floor issue remains. If error patterns are collected at the end of decoding, these patterns have many more errors in the parity region than in the data region. Ideally, training of a neural network should be able to take care of this issue by assigning weights on layers appropriately for different degree distributions. However, it does not hold true in practice.

A deep learning neural network is able to train weights appropriately for all features if the training data is infinite. However, the training data is not infinite. Rather, the training data is finite and limited, which makes the problem challenging.

Also, the training is done in ways such that the loss function is minimized over the training data. The variable nodes in the parity region that cause error floors are numerous in the training data. Weights of neural network layers are not optimized to predict accurately in the parity region.

Embodiments of the present disclosure address these issues and reduce the error floor. Training neural networks are provided to accommodate the degree of distribution of variable nodes. The training can be based on any suitable number of degrees of the LDPC code. Generally, if the code has q different degrees of variable nodes, clustering based on degrees may be utilized to minimize the number of training neural networks according to the complexity. For example, if the code has degrees [10, 9, 8, 7, 6, 4, 3, 2, 1], three (3) clusters may be made: [10, 9, 8, 7, 6], [3, 2], and [1]. In general, higher degree variable nodes are less prone than lower variable nodes to being stuck after decoding, and thus usually can be fixed by a regular deep learning framework. The number of, and variable nodes in, the clusters are not limited to the examples disclosed herein. Rather, the number and content of clusters can be optimized based failure bits and allowed complexity for the particular algorithm. The number of training neural networks should be minimized to reduce training complexity. The number of clusters may be taken low enough that is sufficient to reduce the error floor.

For ease of illustration and by way of example, the case in which three (3) clusters of different degrees of variable nodes is given Each cluster is of one or more different degree variable nodes. In this example, three (3) different training neural networks may be provided for prediction of these variable nodes in the different clusters. However, as noted above, the architecture can be scaled according to the degree of distribution of the variable nodes. Lower degree of distribution would mean less training neural networks, and higher degree of distribution would mean more training neural networks.

Figure 5:
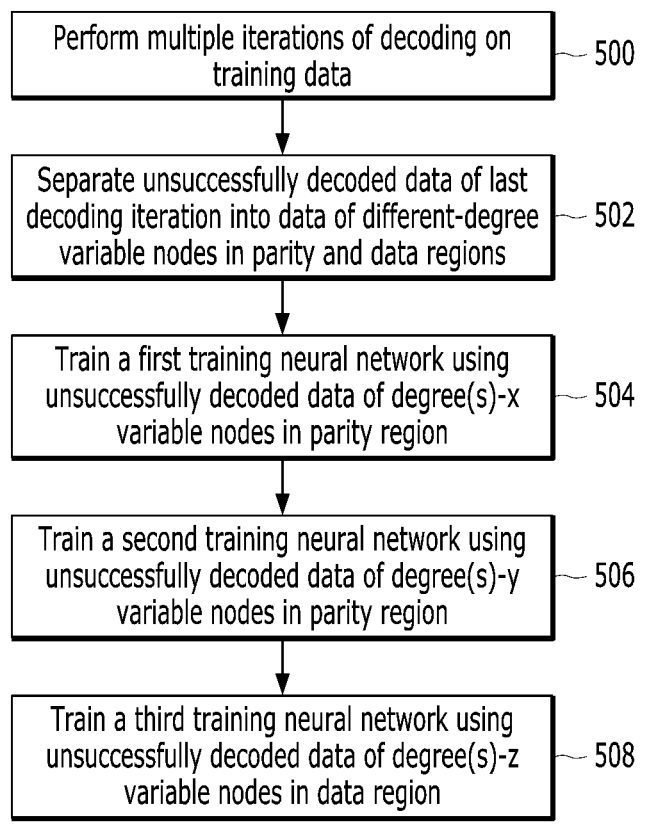
FIG. 5 is a flowchart of steps in a method of decoding in accordance with an embodiment of the present invention.

FIG. 5 is a flow chart describing steps in processes for decoding in accordance with an embodiment of the present invention. The steps shown in flow chart 50 are exemplary. Those skilled in the art will understand that additional or alternative steps may be performed, or that the order of the steps may be changed, in order to effectuate aspects of the present invention without departing from the inventive concepts disclosed herein. The steps of flow chart 50 may be performed by memory components disclosed herein, such a controller, DRAM, ECC component/module, and/or other suitable components.

Figure 6:
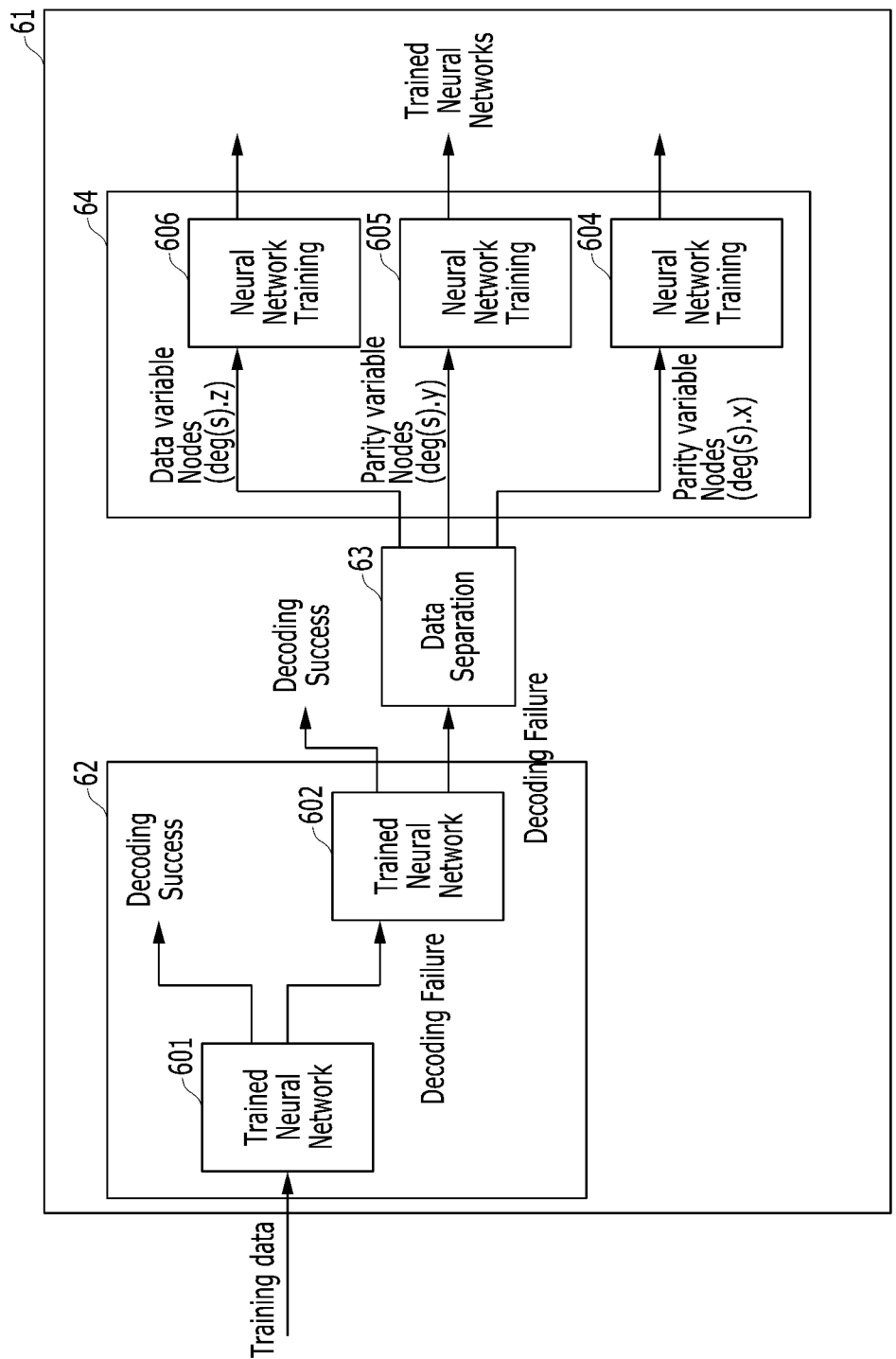
FIG. 6 is a schematic diagram of a training framework for a deep learning network for reducing the error floor of a BF LDPC decoder in accordance with an embodiment of the present invention.

FIG. 6 is a schematic diagram of a training framework for a deep learning network for reducing the error floor of a BF LDPC decoder in accordance with an embodiment of the present invention. The BF LDPC decoder 61 may be implemented by, for example, ECC component 130 of FIG. 1, ECC module 406 of FIG. 4, and/or other suitable components.

Referring to FIG. 5, in conjunction with FIG. 6, exemplary processing is described. Training data, which may be stored in a storage such as in the controller 100, is obtained and input into a trained neural network assembly 62. At step 500, the trained neural network assembly 62 performs multiple iterations of decoding to generate decoded data.

In the illustrated embodiment, the trained neural network assembly 62 comprises two (2) neural networks: a first trained neural network 601 and a second trained neural network 602. Thus, the training data is input to the first trained neural network 601, which performs a first decoding iteration in accordance with its rules. The decoded data includes successfully decoded data and unsuccessfully decoded data, the latter of which is input to the second trained neural network 602. The second trained neural network 602 performs a second decoding iteration in accordance with its rules to generate decoded data that includes both successfully and unsuccessfully decoded data. Additional iterations may be performed depending on various factors including system parameters. The trained neural network assembly 62 may comprise more or less than two (2) trained neural networks depending on complexity.

At step 502, a data separation component 63 receives the unsuccessfully decoded data of the last iteration, e.g., the unsuccessfully decoded data from trained neural network 602 in the illustrated embodiment, and performs data separation on such data. In general, the unsuccessfully decoded data of the last iteration is separated into clusters or data of different-degree variable nodes in the parity and data regions. For example, the received data may be separated into data of degree(s)-x variable nodes in the parity region, data of degree(s)-y variable nodes in the parity region, and data of degree(s)-z variable nodes in the data region, where x, y, and z may represent single degree variable nodes, e.g., 1, 2 and 5, respectively or represent clusters, each of which includes one or more different degree variable nodes. As described above, the separation may be with respect to more and/or different degree variable nodes, and also the separation may be of clusters of different degree variable nodes, depending on the LDPC codes used.

The separated data output by data separation component 63 is used to train the training neural networks 64. In the illustrated embodiment, three (3) training neural networks are provided, one for each of the three degree distribution of variable nodes, which degrees may be generally represented by x, y and z, as described above. Further steps according to the illustrated embodiment are as follows.

At step 504, a first training neural network 604 receives the unsuccessfully decoded data of degree(s)-x variable nodes in the parity region from the data separation component 63 and is trained by such data.

At step 506, a second training neural network 605 receives the unsuccessfully decoded data of degree(s)-y variable nodes in the parity region from the data separation component 63, which data is used to train the second training neural network 605.

At step 508, a third training neural network 606 receives the unsuccessfully decoded data of degree(s)-z variable nodes in the data region from the data separation component 63 and is trained by such data.

The output of the training neural networks 604, 605, 606 including prediction results may be collected and included in the training data to be input into the trained neural network assembly 62 for a subsequent round of processing.

Figure 7:
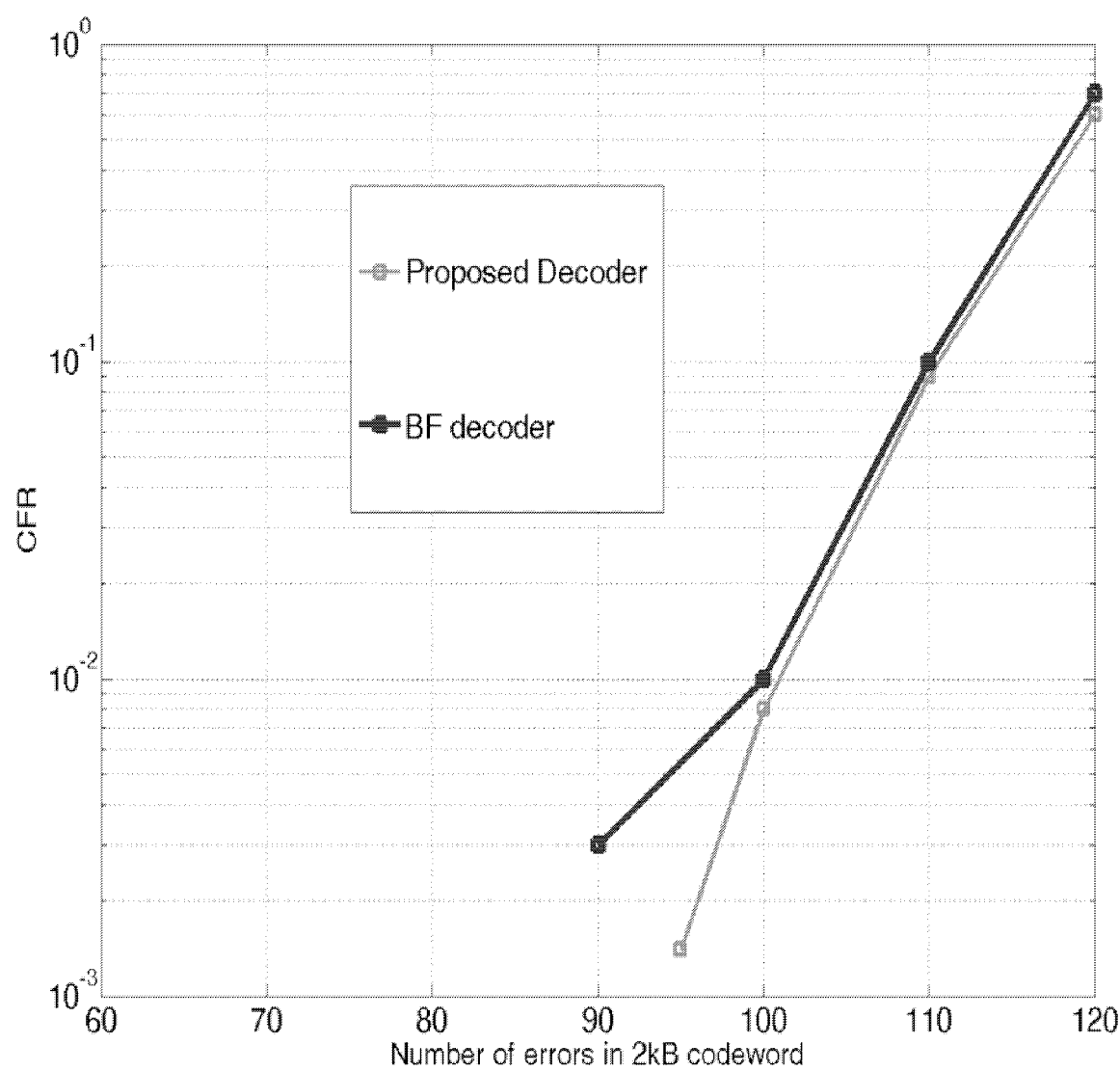
FIG. 7 is a graph illustrating performance of a BF LDPC decoder configured in accordance with an embodiment of the present invention.

FIG. 7 is a graph illustrating the performance of a decoder configured, trained and operated in accordance with embodiments of the present invention (Proposed Decoder), as described herein, with another BF Decoder configured and trained to address the imbalance classes issue but not the error floor issue. As shown in FIG. 7, the decoder in accordance with embodiments of the present invention exhibits a significant reduction in the number of errors in a 2 kB codeword.

As the foregoing describes, embodiments of the present invention provide an improved-performance BF LDPC decoder and memory system including such decoder. Embodiments provide a learning framework based on deep learning that reduces the error floor of such decoder by exploiting the degree distribution information of the constructed LDPC codes.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A memory system, comprising
a memory device; and
a controller in communication with the memory device, the controller comprising storage configured to store training data, and a decoder comprising:
  a trained neural network assembly into which the training data is input, the trained neural network assembly configured to perform multiple iterations of decoding to generate decoded data including unsuccessfully decoded data,
  a data separation component configured to separate the unsuccessfully decoded data output from the trained neural network assembly into multiple clusters of variable nodes of different degrees in parity and data regions of the decoded data, the variable nodes in each cluster having one or more degrees unique to that cluster, and
  training neural networks, each configured to receive from the data separation component the unsuccessfully decoded data of a corresponding cluster of variable nodes.

2. The memory system of claim 1, wherein the unsuccessfully decoded data associated with the variable nodes of different degrees is used to train the training neural networks.

3. The memory system of claim 1, wherein the trained neural network assembly comprises:
  a first trained neural network configured to receive the training data and perform a first decoding iteration in accordance with rules of the first trained neural network to generate first decoded data including first unsuccessfully decoded data, and
  a second trained neural network configured to receive the first unsuccessfully decoded data from the first trained neural network and perform a second decoding iteration in accordance with rules of the second trained neural network to generate second decoded data including second unsuccessfully decoded data.

4. The memory system of claim 3, wherein the data separation component receives and separates the second unsuccessfully decoded data from the second trained neural network.

5. The memory system of claim 4, wherein the training neural networks comprise:
  a first training neural network configured to receive from the data separation component second unsuccessfully decoded data associated with a first cluster of variable nodes of x degree(s),
  a second training neural network configured to receive from the data separation component second unsuccessfully decoded data associated with a second cluster of variable nodes of y degree(s), and
  a third training neural network configured to receive from the data separation component second unsuccessfully decoded data associated with a third cluster of variable nodes of z degree(s).

6. The memory system of claim 5, wherein x is 1, y is 2 and 3, and z is 6, 7, 8, 9 and 10.

7. The memory system of claim 5, wherein x is 1, y is 2 and z is 5.

8. The memory system of claim 1, wherein the storage is further configured to collect the output of the training neural networks, which output includes prediction results of the decoder.

9. A bit-flipping (BF) low-density parity check (LDPC) decoder, comprising:
  a trained neural network assembly into which training data is input, the trained neural network assembly configured to perform multiple iterations of decoding including a first iteration of decoding in which first unsuccessfully decoded data is generated and an $n^{th}$ iteration of decoding in which $n^{th}$ unsuccessfully decoded data is generated, where n is a whole number greater than 1;
  a data separation component configured to separate $n^{th}$ unsuccessfully decoded data output from the trained neural network assembly into multiple clusters of variable nodes in parity and data regions of the decoded data, the variable nodes in each cluster having one or more degrees unique to that cluster; and
  training neural networks, including a first training neural network configured to receive from the data separation component unsuccessfully decoded data of a first cluster of the multiple clusters, a second training neural network configured to receive from the data separation component unsuccessfully decoded data of a second cluster of the multiple clusters, and a third training neural network configured to receive from the data separation component unsuccessfully decoded data of a third cluster of the multiple clusters.

10. The BF LDPC decoder of claim 9, wherein the first cluster comprises variable nodes of degree 1, the second cluster comprises variable nodes of degrees 2 and 3, and the third cluster comprises variable nodes of degrees 6, 7, 8, 9 and 10.

11. The BF LDPC decoder of claim 9, wherein the first cluster comprises degree-1 variable nodes, the second cluster comprises degree-2 variable nodes, and the third cluster comprises degree-5 variable nodes.

12. The BF LDPC decoder of claim 9, the output of the training neural networks, which output includes prediction results, is input to the training neural network assembly.

13. A method of operating a memory system, comprising inputting training data from a storage into a trained neural network assembly of a decoder of the memory system;

performing multiple iterations of decoding in the trained neural network assembly, and outputting unsuccessfully decoded data of a last of the multiple iterations;

separating the unsuccessfully decoded data output from the trained neural network assembly into multiple clusters of variable nodes of different degrees in parity and data regions of the unsuccessfully decoded data, the variable nodes in each cluster having one or more degrees unique to that cluster; and training a plurality of neural networks, each receiving the unsuccessfully decoded data of a corresponding cluster of variable nodes.

14. The method of claim 13, wherein the separating comprises:

separating the unsuccessfully decoded data with respect to variable nodes of q different degrees, and clustering the variable nodes of q different degrees into a plurality of clusters, one for each of the plurality of neural networks, each cluster comprising variable nodes of one or more degrees, where q represents the number of different degrees of the variable nodes.

15. The method of claim 14, wherein the training comprises:

training a first neural network using a first cluster of variable nodes of degree 1, training a second neural network using a second cluster of variable nodes of degrees 2 and 3, and training a third neural network using a third cluster of variable nodes of degrees 6, 7, 8, 9 and 10.

16. The method of claim 14, wherein the training comprises:

training a first neural network using a first cluster of degree-1 variable nodes, training a second neural network using a second cluster of degree-2 variable nodes, and training a third neural network using a third cluster of degree-5 variable nodes.

17. The method of claim 14, wherein the performing comprises:

performing a first of the multiple iterations of decoding to generate first unsuccessfully decoded data in a first trained neural network of the trained neural network assembly in accordance with rules of the first trained neural network, performing a second of the multiple iterations of decoding to generate second unsuccessfully decoded data in second trained neural network of the trained neural network assembly in accordance with rules of the second trained neural network.

18. The method of claim 17, wherein the second iteration is the last of the multiple iterations.

19. The method of claim 17, wherein the second unsuccessfully decoded data is used in the separating operation.

\* \* \* \* \*